United States Patent
Kuo et al.

(10) Patent No.: US 8,645,442 B2
(45) Date of Patent: Feb. 4, 2014

(54) METHOD AND APPARATUS FOR A FINITE IMPULSE RESPONSE FILTER

(75) Inventors: Yea Zong Kuo, Rockwall, TX (US);
Jerry William Yancey, Rockwall, TX (US)

(73) Assignee: L-3 Communications Integrated Systems, L.P., Greenville, TX (US)

( * ) Notice: Subject to any disclaimer, the term of this patent is extended or adjusted under 35 U.S.C. 154(b) by 900 days.

(21) Appl. No.: 12/643,456

(22) Filed: Dec. 21, 2009

(65) Prior Publication Data
US 2011/0153705 A1      Jun. 23, 2011

(51) Int. Cl.
*G06F 17/10*      (2006.01)

(52) U.S. Cl.
USPC ........................................ 708/300; 710/313

(58) Field of Classification Search
None
See application file for complete search history.

(56) References Cited

U.S. PATENT DOCUMENTS

| | | | | |
|---|---|---|---|---|
| 5,513,223 A | * | 4/1996 | Shoji ............................. | 375/350 |
| 6,065,127 A | * | 5/2000 | Aizenberg et al. ............. | 713/401 |
| 7,587,577 B2 | * | 9/2009 | Royer et al. .................... | 712/34 |
| 2002/0199078 A1 | * | 12/2002 | Aizenberg et al. ............. | 711/211 |
| 2004/0078403 A1 | * | 4/2004 | Scheuermann et al. ....... | 708/322 |
| 2006/0087466 A1 | * | 4/2006 | Domingo ...................... | 341/144 |

* cited by examiner

*Primary Examiner* — Ilwoo Park
(74) *Attorney, Agent, or Firm* — Hovey Williams LLP

(57) ABSTRACT

A finite impulse response filter comprises an input formatter, a plurality of sample registers, a plurality of coefficient registers, an arithmetic unit, a multiply accumulate unit, a crosspoint switch, an interpolator, a control unit, and an output formatter. The input formatter separates the in-phase portion of a complex-number discrete-time sample from the quadrature portion. The sample registers store a plurality of discrete-time samples. The coefficient registers store a plurality of coefficients. The arithmetic unit adds two of the discrete-time samples to create a sum. The multiply accumulate unit includes a multiplier that multiplies the sum by a coefficient to create a product, an adder that adds the product to a sum of products, and a register that stores the sum of products. The crosspoint switch allows communication between the first and second plurality of registers and the arithmetic unit and the multiply accumulate unit. The interpolator inserts a desired number of zeros into the time-sampled data stream to adjust the time-sampled data stream to an increasing sampling rate. The control unit controls the settings of the crosspoint switch, the arithmetic unit, and the multiply accumulate unit. The output formatter combines the in-phase sum of products and the quadrature sum of products to create a filtered complex-number discrete-time sample.

8 Claims, 6 Drawing Sheets

METHOD AND APPARATUS FOR A FINITE IMPULSE RESPONSE FILTER

BACKGROUND OF THE INVENTION

1. Field of the Invention

Embodiments of the present invention relate to digital signal processing. More particularly, embodiments of the present invention relate to finite impulse response filtering a time-sampled data stream.

2. Description of Related Art

Digital signal processing architectures can perform a variety of functions including filtering. Finite impulse response filters are often utilized because they can be designed to have linear phase. Finite impulse response filters are generally characterized as a sum of products function. Thus, it is generally beneficial for the filter architecture to include multiplication units or multiply-accumulate units that are optimized for repetitive multiply and accumulate operations. Furthermore, for a complex-number finite impulse response filter, it is beneficial to process the in-phase portion of the signal separately from the quadrature portion of the signal.

SUMMARY OF THE INVENTION

Embodiments of the present invention solve the above-mentioned problems and provide a distinct advance in the art of digital signal processing. More particularly, embodiments of the invention provide a finite impulse response (FIR) filter that is operable to decompose a complex-number data stream into in-phase and quadrature components and perform filtering operations on the in-phase and quadrature portions.

In various embodiments, the FIR filter comprises a plurality of sample registers, a plurality of coefficient registers, an arithmetic unit, a multiply accumulate unit, a crosspoint switch, an interpolator, and a control unit. The sample registers store a plurality of discrete-time samples. The coefficient registers store a plurality of coefficients. The arithmetic unit adds two of the discrete-time samples to create a sum. The multiply accumulate unit includes a multiplier that multiplies the sum by a coefficient to create a product, an adder that adds the product to a sum of products, and a register that stores the sum of products. The crosspoint switch allows communication between the first and second plurality of registers and the arithmetic unit and the multiply accumulate unit. The interpolator inserts a desired number of zeros into the time-sampled data stream to adjust the time-sampled data stream to an increasing sampling rate. The control unit controls the settings of the crosspoint switch, the arithmetic unit, and the multiply accumulate unit.

In various other embodiments, the FIR filter includes an input formatter, an output formatter and other components to handle a complex-number discrete-time sampled data stream. The input formatter decomposes a complex-number discrete-time sample into an in-phase sample and a quadrature sample. The sample registers store a plurality of discrete-time samples. The coefficient registers store a plurality of complex-number coefficients. An in-phase arithmetic unit adds two in-phase data stream numbers to create an in-phase sum. A quadrature arithmetic unit adds two quadrature data stream numbers to create a quadrature sum. An in-phase multiply accumulate unit includes an in-phase multiplier that multiplies the in-phase sum and the quadrature sum by a complex-number coefficient to create an in-phase product, an in-phase adder that adds the in-phase product to a in-phase sum of products, and a register that stores the in-phase sum of products. A quadrature multiply accumulate unit includes a quadrature multiplier that multiplies the in-phase sum and the quadrature sum by a complex-number coefficient to create a quadrature product, a quadrature adder that adds the quadrature product to a quadrature sum of products, and a quadrature register that stores the quadrature sum of products. The output formatter combines the in-phase sum of products and the quadrature sum of products to create the filtered complex-number discrete-time sample.

This summary is provided to introduce a selection of concepts in a simplified form that are further described below in the detailed description. This summary is not intended to identify key features or essential features of the claimed subject matter, nor is it intended to be used to limit the scope of the claimed subject matter.

Other aspects and advantages of the present invention will be apparent from the following detailed description of the preferred embodiments and the accompanying drawing figures.

BRIEF DESCRIPTION OF THE DRAWING FIGURES

A preferred embodiment of the present invention is described in detail below with reference to the attached drawing figures, wherein.

Figure 1:
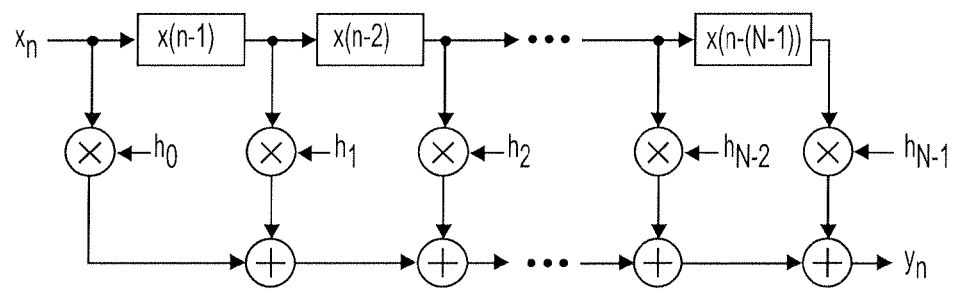
FIG. 1 is a logic diagram of an implementation of a finite impulse response filter.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE PREFERRED EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

A finite impulse response (FIR) filter is a digital signal processing (DSP) element that operates on a time-sampled digital data stream. As with nearly all systems in which DSP elements are utilized, a signal is anti-aliasing filtered as it enters the DSP system so as to meet the Nyquist sampling criterion and reduce undesirable high-frequency components. The signal is then time sampled and converted to a digital format to create the time-sampled digital data stream.

The FIR filter generally receives a sequence of discrete-time samples from the time-sampled data stream as an input and produces an output that is a sequence of discrete-time samples corresponding to the input samples that have been filtered according to the parameters of the FIR filter. An FIR filter is generally characterized by EQ. 1:

$$y(n) = \sum_{i=0}^{N-1} h(i)x(n-i) \quad \text{EQ. 1}$$

where y(n) is the discrete-time output, x(n−i) is the discrete-time input, and h(i) is the filter coefficient, which is also referred to as a filter tap. A logical implementation of the FIR filter is shown in FIG. 1.

As is evident from EQ. 1, each present output y(n) is dependent upon a number, N, of past time samples x(n−i) as well as filter coefficients h(i). The nature of the filter, or its frequency response, affects the number of previous time samples and filter coefficients that are required. For example, a filter with multiple stopbands (range of frequencies where the signal is attenuated) or passbands (range of frequencies where the signal is not attenuated) or a filter with a sharp transition between the passband and the stopband generally requires a greater number of past time samples and coefficients. Alternatively, a simple filter with a gradual transition between the passband and the stopband requires fewer previous time samples and coefficients.

Filters in general inherently possess a system time delay, which is the amount of time for a given input to reach the output. FIR filters can be designed to possess the generally desirable system property of linear phase, in which the time delay through the filter is the same for all frequencies of the discrete-time sampled input. A linear-phase FIR filter is implemented by requiring that the values of the filter coefficients, h(i), be symmetric about the midpoint of the coefficients. Thus, if i ranges from 0 to N−1, then under the linear-phase condition, h(0)=h(N−1), h(1)=h(N−2), etc. If N is even, then h((N/2)−1)=h(N/2). If N is odd, then h((N−1)/2) is the center coefficient with no equivalent.

Expanding EQ. 1 yields EQ. 2:

$$y(n)=h(0)x(n)+h(1)x(n-1)+\ldots+h(N-1)x(n-(N-1)) \quad \text{EQ. 2}$$

where x(n) is the most recent time sample and x(n−(N−1)) is the oldest time sample. Applying the linear phase condition to EQ. 2 yields EQ. 3:

$$y(n)=h(0)[x(n)+x(n-(N-1))]+h(1)[x(n-1)+x(n-(N-2))]+ \quad \text{EQ. 3}$$

Comparing EQ. 3 with EQ. 2, it can be seen that the linear-phase FIR filter reduces the number of multiplications by approximately half and adds two of the time samples before performing the coefficient multiplication. The reduction of multiplication is generally desirable as multiplication takes more time and more resources to perform as compared with addition.

Figure 2:
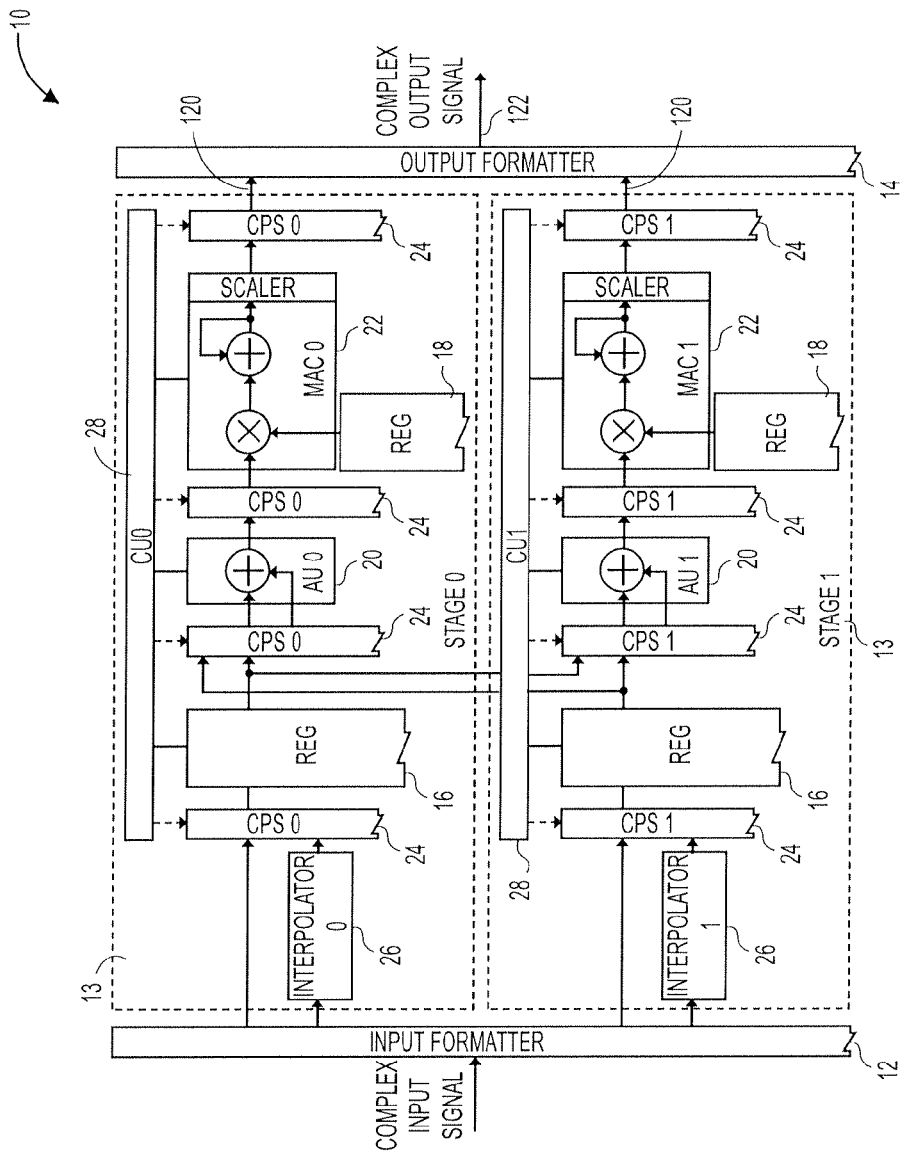
FIG. 2 is a block diagram of a finite impulse response filter constructed in accordance with various embodiments of the present invention.

FIG. 2 shows an FIR filter 10 constructed in accordance with various embodiments of the present invention. The FIR filter 10 comprises an input formatter 12, a pair of stages 13, and an output formatter 14.

In various embodiments, the FIR filter 10 is operable to improve the performance of filtering a complex-number discrete-time sampled data stream by filtering the in-phase portion and the quadrature portion of each sample separately. The input formatter 12 is operable to decompose a complex number into an in-phase component and a quadrature component. The input formatter 12 forwards the in-phase component to one stage 13, for example Stage 0 in FIG. 2, and forwards the quadrature component to another stage 13, for example Stage 1 in FIG. 2.

In certain embodiments, the FIR filter 10 is operable to perform filtering of complex-number discrete-time samples without separating the in-phase and quadrature components of the data. The input formatter 12 forwards the entire complex-number discrete-time sample to each stage 13. In other embodiments, the FIR filter 10 is operable to perform filtering of real-number discrete-time samples. The input formatter 12 forwards real-number discrete-time samples to each stage 13.

The input formatter 12 may be formed from standard combinational logic, custom logic, one or more code segments of an HDL, or combinations thereof and may be implemented as a sea of gates, a field-programmable gate array (FPGA), a programmable logic device (PLD), a fully-custom or semi-custom application-specific integrated circuit (ASIC), combinations thereof, and the like.

Each stage 13 comprises a plurality of sample registers 16, a plurality of coefficient registers 18, an arithmetic unit 20, a multiply accumulate unit (MAC) 22, a crosspoint switch 24, an interpolator 26, and a control unit 28.

In various embodiments, the sample registers 16 are operable to store a portion of a time-sampled data stream. The number of sample registers 16 is proportional to the number, N, of past time samples and filter coefficients from EQ. 1 and will vary as the desired frequency response of the FIR filter 10 changes. The number of registers 16 may be equivalent to N if the width (number of bits) of each register is equal to the width of the discrete-time samples. Or, the number of registers 16 may be equal to a factor of N (e.g., 2N) if the width of each register is less than the discrete-time sample word width.

The sample registers 16 may be formed from registers as is known in the art, such as latches that may be level-triggered or edge-triggered, flip-flops of various types (e.g., D, JK, S/R), random access memory (RAM) cells of various types (e.g., dynamic, static), one or more code segments of a hardware description language (HDL), combinations thereof, and the like. The sample registers 16 may also be implemented as a shift register that may be formed from the registers described above, wherein the time samples shift from one register to the next on every clock cycle (the internal clock rate) or as a new time sample is introduced to the FIR filter 10 (the sampling rate).

The sample registers 16 may receive or read data from the crosspoint switch 24. The sample registers 16 may also send or write data to the crosspoint switch 24. The operation of the sample registers 16 may be controlled by the control unit 28.

In various embodiments, the coefficient registers 18 are operable to store a plurality of filter coefficients as denoted by h(i) in EQ. 1. The number of coefficient registers 18 varies depending on the type of filter that is implemented and the width of the registers that are utilized. A non-linear-phase FIR filter may require N filter coefficients. A linear-phase FIR filter may require N/2 coefficients if N is even and (N+1)/2 coefficients if N is odd. Similar to the sample registers 16, the number of coefficient registers 18 may increase if the width of the registers used is less than the width of the discrete-time sample.

The coefficient registers 18 may be formed from registers as is known in the art, such as latches that may be level-triggered or edge-triggered, flip-flops of various types (e.g., D, JK, S/R), RAM cells of various types (e.g., dynamic, static), one or more code segments of an HDL, combinations thereof, and the like. Since it is possible that the type of filter and the frequency response parameters of the filter may be set and then unchanged for extended periods of time (such as in an audio or video system), the coefficient registers 18 may include read-only memory (ROM) components such as programmable ROMs (PROMs), erasable PROMs (EPROMs), electrically-erasable PROMs (EEPROMs), other non-volatile memory (NVM) components, one or more code segments of an HDL, combinations thereof, and the like.

In some embodiments, the coefficient registers 18 may send data primarily to the MAC 22 directly. In other embodiments, the coefficient registers 18 may send and receive data from the crosspoint switch 24. If the coefficient registers 18 need to be programmed, they may receive the coefficients from the crosspoint switch 24 and may be programmed by the control unit 28.

Figure 3:
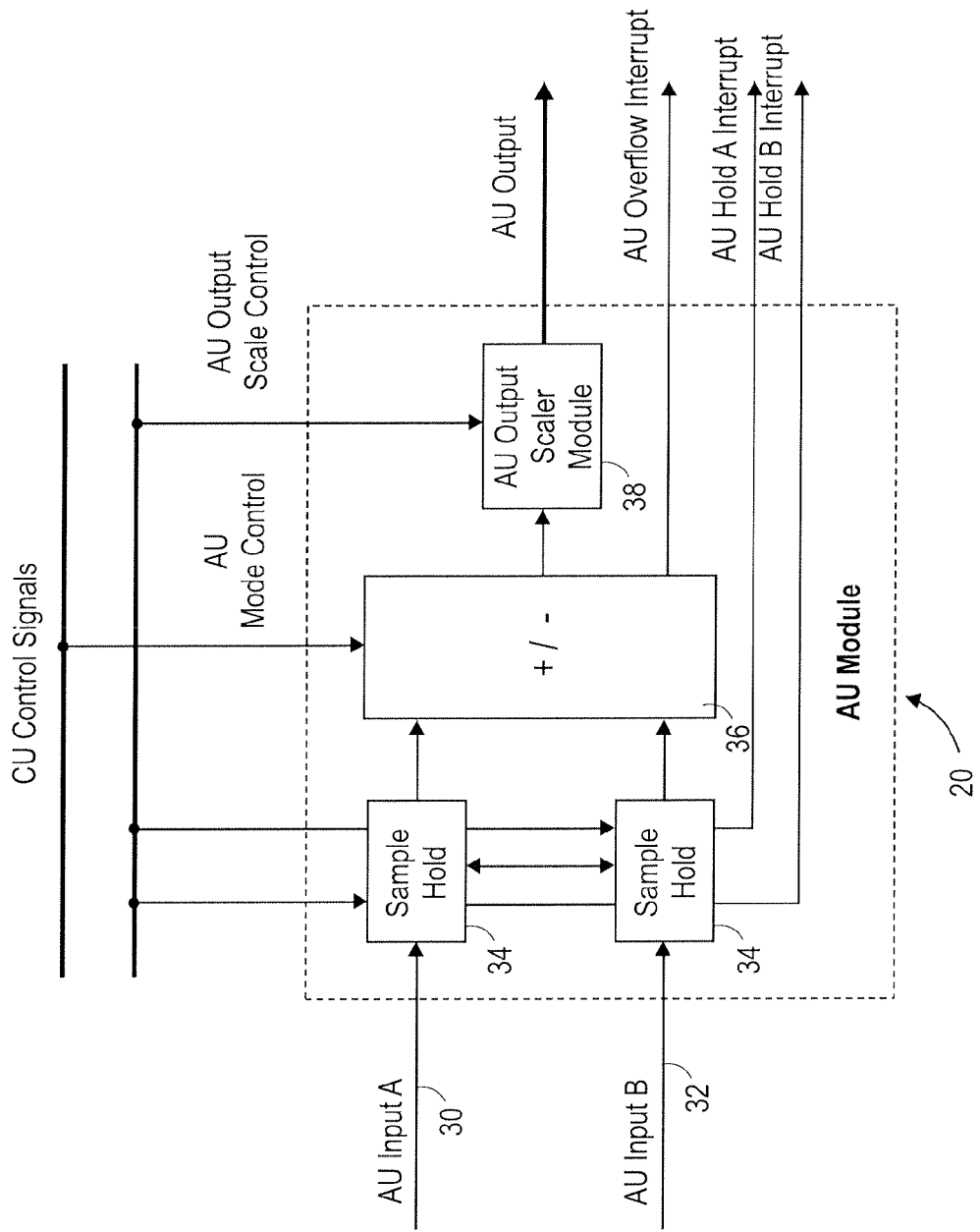
FIG. 3 is a block diagram of an arithmetic unit.

In various embodiments, the arithmetic unit 20 is operable to add two discrete-time samples together to create a sum. The arithmetic unit 20 is shown in more detail in FIG. 3 and includes two inputs—InA 30 and InB 32, an arithmetic sample and hold register 34 for each input, an adder/subtracter 36, and an arithmetic output scaler 38. The arithmetic sample and hold register 34 receives data from the crosspoint switch 24 and holds the data at the input of the adder/subtracter 36 until the adder/subtracter 36 has completed its operation. The adder/subtracter 36 performs two operations as determined by the control unit 28—addition (InA 30+InB 32) and subtraction (InA 30−InB 32). The sum or difference may be forwarded to the arithmetic output scaler 38, which is operable to adjust the magnitude of the sum or difference. The output of the arithmetic scaler 38 may be sent to the crosspoint switch 24.

The arithmetic sample and hold register 34 also includes a hold interrupt output that generates an error to the control unit 28 if data is written to the register 34 before the adder/subtracter 36 has finished its operation. In addition, the adder/subtracter 36 includes an overflow interrupt signal to the control unit 28 if an overflow condition occurs when the sum or difference is larger than the adder/subtracter 36 can manage. If overflow occurs, the adder/subtracter 36 produces a saturated value.

The arithmetic sample and hold register 34 may be formed from registers as is known in the art, such as latches that may be level-triggered or edge-triggered, flip-flops of various types (e.g., D, JK, S/R), RAM cells of various types (e.g., dynamic, static), one or more code segments of an HDL, combinations thereof, and the like. The adder/subtracter 36 and the arithmetic output scaler 38 may be formed from standard combinational logic, custom logic, one or more code segments of an HDL, or combinations thereof and may be implemented as a sea of gates, an FPGA, a PLD, a fully-custom or semi-custom ASIC, combinations thereof, and the like.

Figure 4:
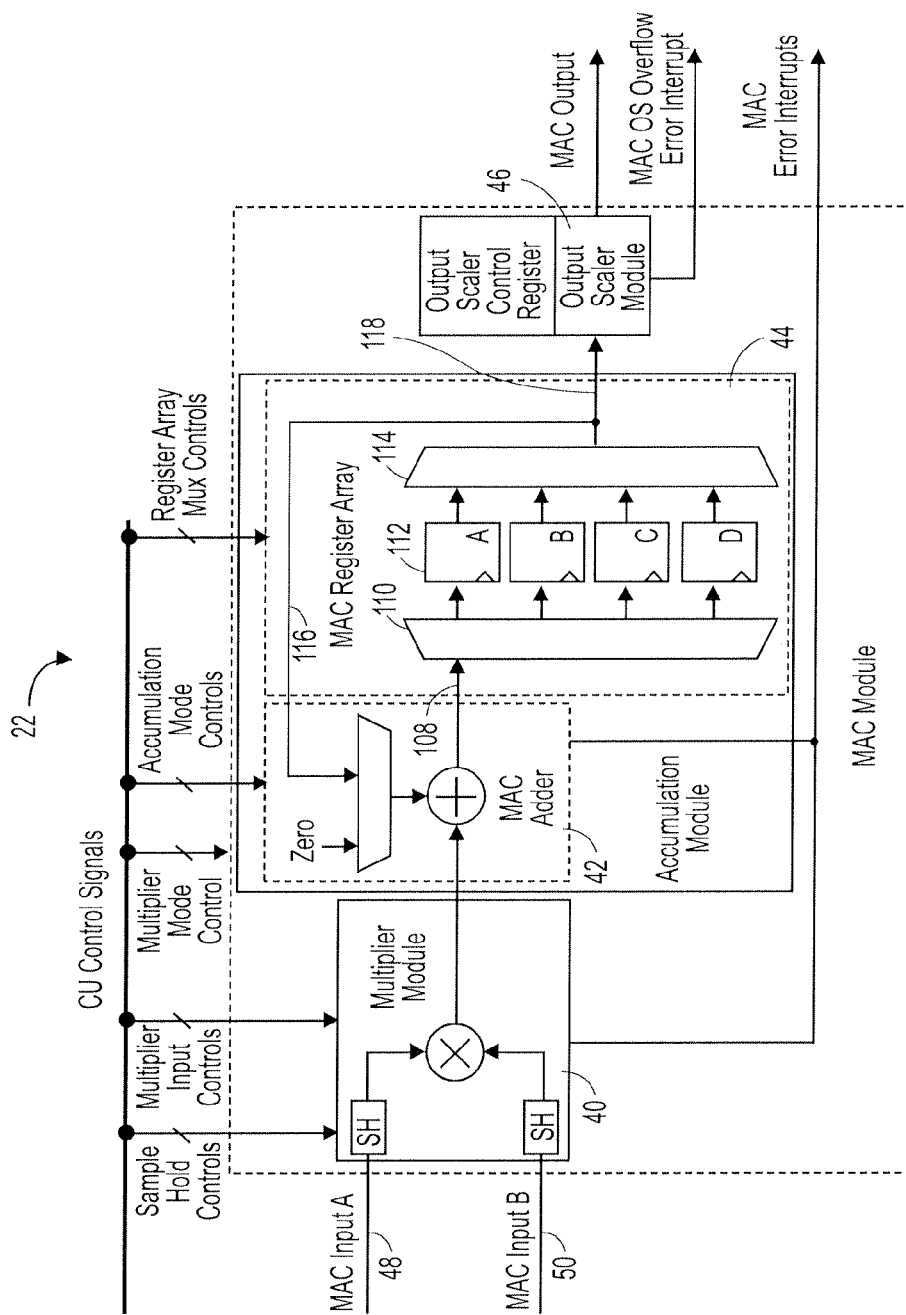
FIG. 4 is a block diagram of a multiply accumulate unit.

In various embodiments, the MAC 22, shown in FIG. 4, includes a multiplier module 40, an adder module 42, a register module 44, and a MAC output scaler 46. There are also control signals from the control unit 28 that control the operation of the multiplier module 40, the adder module 42, the register module 44, and the MAC output scaler 46.

Figure 5:
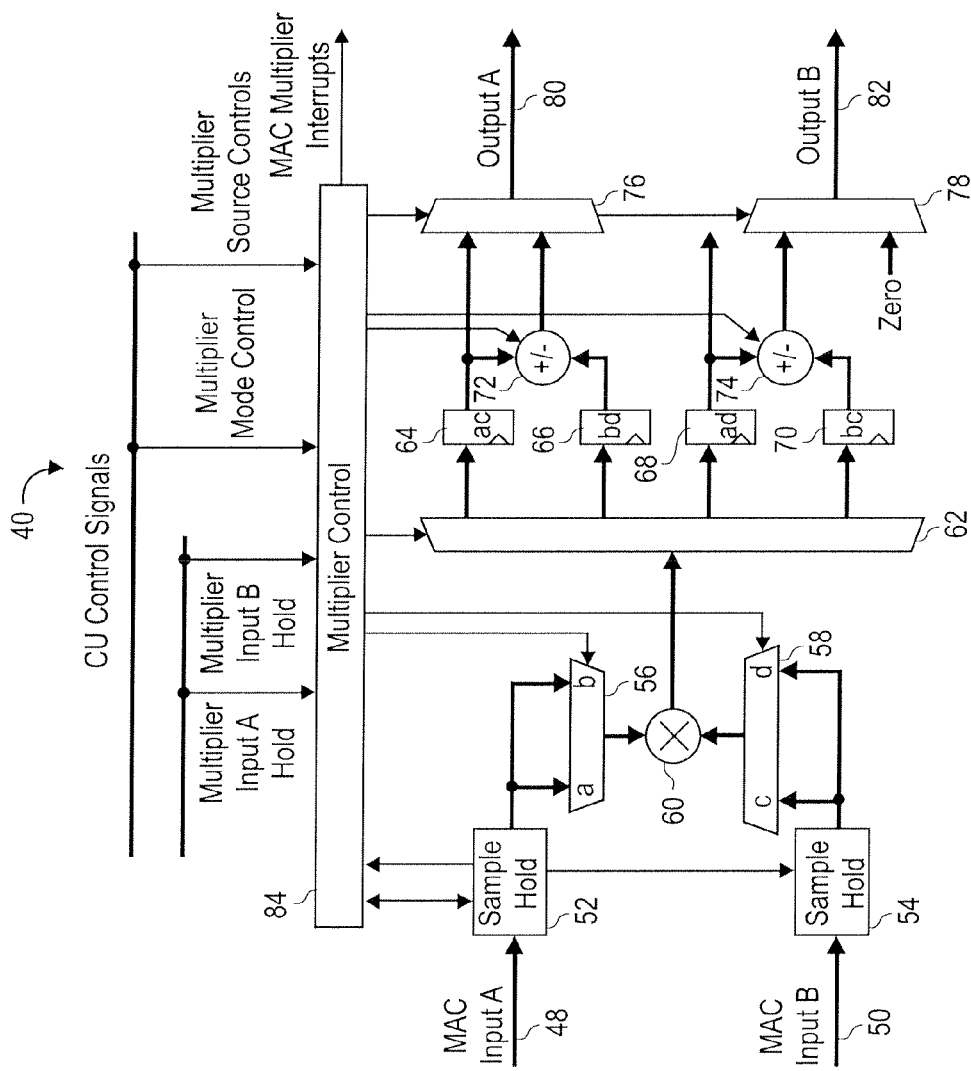
FIG. 5 is a block diagram of a multiplier.

In various embodiments, the multiplier module 40, shown in FIG. 5, is operable to multiply the sum from the arithmetic unit 20 by a coefficient to produce a product. The multiplier includes two inputs, InA 48 and InB 50, MAC sample and hold register A 52, MAC sample and hold register B 54, MAC input multiplexer (IN MUX) A 56, MAC IN MUX B 58, a multiplier 60, a multiplier demultiplexer (DEMUX) 62, four product registers 64, 66, 68, 70, two product adder/subtracters 72, 74, two multiplier output MUXs 76, 78, two outputs OutA 80 and OutB 82, and a multiplier control unit 84.

Multiplier inputs InA 48 and InB 50 connect to MAC sample and hold A 52 and MAC sample and hold B 54, which in turn connect to MAC IN MUX A 56 and MAC IN MUX B 58, respectively. The outputs of MAC IN MUX A 56 and B 58 serve as the inputs to the multiplier 60. The A and B sample and hold registers 52, 54 maintain the data to be multiplied by the multiplier 60 until the multiplication operation is complete. If data is written to one of the registers 52, 54 before the multiplication is complete, then that register generates an interrupt error to the multiplier control unit 84.

The output of the A and B sample and hold registers 52, 54 is split to connect to the two inputs of the MAC IN MUXs 56, 58. Typically, half of the bits of the A and B sample and hold registers 52, 54 outputs are connected to one input, for example the a input of MAC IN MUX A 56 and the other half of the bits of the A and B sample and hold registers 52, 54 outputs are connected to the other input, for example the b input of MAC IN MUX A 56. With this structure, the multiplier is operable to generate four different products. With reference to the a and b inputs of MAC IN MUX A 56 and the c and d inputs of MAC IN MUX B 58, the multiplier can produce the products ac, bd, ad, and bc that are fed through the multiplier DEMUX 62 and stored in registers 64, 66, 68, 70, respectively. Product registers 64 and 66 provide the inputs to product adder/subtracter 72, while product registers 68 and 70 provide the inputs to product adder/subtracter 74.

In certain embodiments, the multiplier module 40 is operable to perform complex-number multiplication. The a and c inputs of the MAC IN MUXs 56, 58 include the in-phase portion of the complex number, while the b and d inputs of the MAC IN MUXs 56, 58 include the quadrature portion of the complex number. The result of the complex number multiplication is (ac−bd)+j(ad+bc). Thus, the output MUXs 76, 78 are programmed to select the inputs from the two adder/subtracters 72, 74 to pass to the outputs OutA 80 and OutB 82.

In other embodiments, the multiplier module 40 is operable to perform real-number multiplication. The a input of MAC IN MUX A 56 and the c input of MAC IN MUX B 58 include real-number data. The multiplication product is simply ac, and the output MUXs 76, 78 are programmed to select the register 64 output and the "zero" inputs (which is simply the value 0) respectively, to pass to outputs OutA 80 and OutB 82.

The sample and hold registers A 52 and B 54 as well as the product registers 64, 66, 68, 70 may be formed from registers as is known in the art, such as latches that may be level-triggered or edge-triggered, flip-flops of various types (e.g., D, JK, S/R), RAM cells of various types (e.g., dynamic, static), one or more code segments of an HDL, combinations thereof, and the like.

The multiplexers 56, 58, 76, 78, the DEMUX 62, the multiplier 60, and the adder/subtracters 72, 74 may be formed from standard combinational logic, custom logic, one or more code segments of an HDL, or combinations thereof and may be implemented as a sea of gates, an FPGA, a PLD, a fully-custom or semi-custom ASIC, combinations thereof, and the like.

In certain embodiments, the multiplier control unit 84 may be a part of the main control unit 28. In other embodiments, the multiplier control unit 84 may be a separate entity that interfaces with the main control unit 28, and may be formed from microcontrollers, microprocessors, FPGAs, PLDs, combinational logic coupled with finite state machines (FSMs), one or more code segments of an HDL, combinations thereof, and the like.

Figure 6:
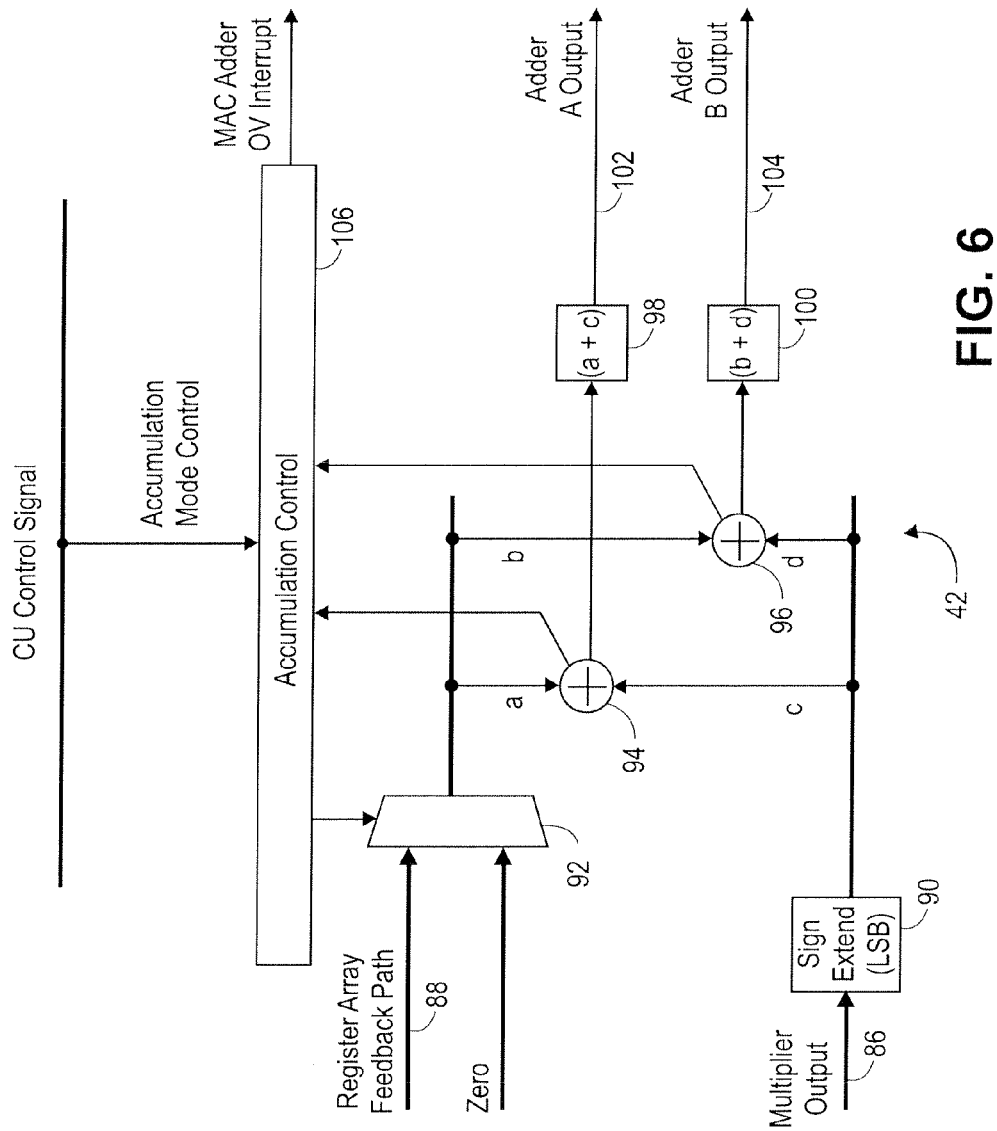
FIG. 6 is a block diagram of an adder.

In various embodiments, the adder module 42, shown in FIG. 6, includes a product input 86 from the multiplier module 40, a feedback input 88 from the MAC register 44, a sign extension unit 90, an adder input MUX 92, two adders 94, 96, two output registers 98, 100, two outputs OutA 102, OutB 104, and an accumulation control unit 106.

The product input 86 is forwarded to the sign extension unit 90, which may preserve the sign (positive or negative) of the data if the width of the data is changed before the data is accumulated. After the sign extension unit 90, the product input 86 is split into two paths that connect to the adders 94, 96. Typically, one half the bits of the product input 86 are connected to one adder 94 and the other half of the bits are connected to the other adder 96. The other inputs to each adder 94, 96 are controlled by the adder input MUX 92.

If the first term of the filter, h(0)x(n) from EQ. 2 or h(0)[x(n)+x(n−(N−1))] from EQ. 3, is at the product input 86, then the filtering process has just started and there are no past sample terms to which to add the product input 86. Thus, the accumulation control unit 106 selects the "zero" input to the adder input MUX 92 and the value 0 is added to the data at the product input 86. Otherwise, if the second term or higher of the filter is at the product input 86, then the accumulation control unit 106 selects the feedback input 88 to pass through the adder input MUX 92. Hence, the term that is at the product input 86 is added to the feedback input 88 data, which is the sum of previous products. The data from both adders 94, 96 is temporarily stored in output registers 98, 100 and is available to outputs OutA 102, OutB 104. If either adder 94, 96 experiences an overflow, the adder 94, 96 sends an overflow signal to the accumulation control unit 106, which may in turn forward an interrupt to the main control unit 28.

In certain embodiments, the adder module 42 is operable to perform complex-number addition. The data at the product input 86 as well as the feedback input 88 data is split into an in-phase portion and a quadrature portion, wherein the in-phase data from both inputs 86, 88 is added by adder 94 and the quadrature data is added by adder 96.

In other embodiments, the adder module 42 is operable to perform real-number addition. The real-number portion of the product input 86 and the feedback input 88 are added by the adder 94 and stored in output register 98. The rest of the data of both inputs 86, 88 may be padded with zeros.

In some embodiments, the accumulation control unit 106 may be included in the main control unit 28, or in other embodiments, the accumulation control unit 106 may be a separate entity that interfaces with the main control unit 28 both sending and receiving control signals. The accumulation control unit 106 may be formed from microcontrollers, microprocessors, FPGAs, PLDs, combinational logic coupled with finite state machines (FSMs), one or more code segments of an HDL, combinations thereof, and the like.

The adder input MUX 92 and the adders 94, 96 may be formed from standard combinational logic, custom logic, one or more code segments of an HDL, or combinations thereof and may be implemented as a sea of gates, an FPGA, a PLD, a fully-custom or semi-custom ASIC, combinations thereof, and the like.

The output registers 98, 100 may be formed from registers as is known in the art, such as latches that may be level-triggered or edge-triggered, flip-flops of various types (e.g., D, JK, S/R), RAM cells of various types (e.g., dynamic, static), one or more code segments of an HDL, combinations thereof, and the like.

In various embodiments, the MAC register module 44 is operable to receive and store the output from the adder module 42. The MAC register module 44, as seen in FIG. 4, includes an adder module input 108, a register DEMUX 110, a register 112, a register MUX 114, a feedback output 116, and a MAC register output 118.

The register DEMUX 110 receives the sum from the adder module input 108 and forwards the sum to the register 112. In various embodiments, the register 112 may include a plurality of registers (e.g., A, B, C, D as seen in FIG. 4) that hold various portions of the sum of products. The output of the register 112 couples with the register MUX 114. The output of the register MUX 114 is forwarded to both the feedback output 116 and the MAC output 118. The feedback output 116 forwards the intermediate sum of products to the adder module 42 to couple with the feedback input 88. This feedback path is utilized to continue the accumulation process until all the product terms have been added. The register output 118 forwards the final accumulated value to the MAC output scaler 46, which may scale the accumulated value to a desired magnitude typically by utilizing a logical shift function, as is known in the art.

The register 112 of the register module 44 may be formed from registers as is known in the art, such as latches that may be level-triggered or edge-triggered, flip-flops of various types (e.g., D, JK, S/R), RAM cells of various types (e.g., dynamic, static), one or more code segments of an HDL, combinations thereof, and the like.

The register DEMUX 110, the register MUX 114, and the MAC output scaler 46 may be formed from standard combinational logic, custom logic, one or more code segments of an HDL, or combinations thereof and may be implemented as a sea of gates, an FPGA, a PLD, a fully-custom or semi-custom ASIC, combinations thereof, and the like.

In various embodiments, the crosspoint switch 24 is operable to manage the flow of data through the FIR filter 10. The crosspoint switch 24 couples with the input formatter 12, the interpolator 26, the sample registers 16, the arithmetic unit 20, the coefficient registers 18, the MAC unit 22, and the output formatter 14. Furthermore, the crosspoint switch 24 of one stage 13 may communicate with the crosspoint switch of another one or more stages 13. Thus, data may flow from the components of one stage to the components of one or more other stages.

The crosspoint switch 24 may be considered a component that includes an input/output port with each of the components listed and allows communication between any one of the components and any other one or more of the components. Furthermore, the crosspoint switch 24 allows components to be bypassed if they are not needed. For example, if a linear-phase FIR filter is not desired, then the arithmetic unit 20 is not needed to perform the preliminary addition of the two discrete-time samples, and therefore data from the sample registers 16 can be forwarded to the MAC unit 22 through the crosspoint switch 24.

The crosspoint switch 24 may include multiplexing elements that select one of many inputs to be transferred to a given output. The switch 24 may include demultiplexing elements that select one of many outputs to receive data from a given input. The switch 24 may be formed from standard combinational logic, custom logic, one or more code segments of an HDL, or combinations thereof and may be implemented as a sea of gates, an FPGA, a PLD, a fully-custom or semi-custom ASIC, combinations thereof, and the like.

In various embodiments, the interpolator 26 is operable to insert a desired number of zeros into the time-sampled data stream to adjust the time-sampled data stream to an increasing sampling rate. The interpolator 26 is used when the FIR filter 10 is coupled with other DSP components that operate at higher sampling rates. The interpolator 26 inserts zero-valued samples into the discrete-time sampled data stream based on the difference in system sampling rates. The greater the difference in sampling rates, the more zero samples that are inserted; the less the difference, the fewer zero samples that are inserted. If needed, the interpolator 26 interpolates the discrete-time samples before the samples are filtered. The interpolator 26 may be formed from standard combinational logic, custom logic, one or more code segments of an HDL, or combinations thereof and may be implemented as a sea of gates, an FPGA, a PLD, a fully-custom or semi-custom ASIC, combinations thereof, and the like.

In various embodiments, the control unit 28 is operable to control the settings of the crosspoint switch 24, the arithmetic unit 20, and the MAC unit 22. The control unit 28 also controls the flow of data to and from the sample registers 16 and the coefficient registers 18. The control unit 28 controls the structure of the crosspoint switch 24 to determine which components can receive data from a given component. For example, the sample registers 16 may send data to either the arithmetic unit 20 or the MAC unit 22, depending on the settings of the crosspoint switch 24 as determined by the control unit 28.

The control unit 28 may determine and control whether the arithmetic unit 20 performs addition or subtraction and whether the arithmetic output scaler 38 adjusts the magnitude of the adder/subtracter 36 output. In certain embodiments, the control unit 28 may send and receive control signals to the multiplier control unit 84 and the accumulator control unit 106 within the MAC unit 22. In other embodiments, the control unit 28 may directly control the operation of the MAC unit 22 by controlling the settings of the MUXs and DEMUXs that establish the flow of data through the MAC 22. Furthermore, the control unit 28 of one stage 13 may communicate with the control units 28 of one or more other stages 13. In various embodiments, there may be one control unit 28 to control the components of one or more other stages 13.

The control unit 28 may be formed from microcontrollers, microprocessors, FPGAs, PLDs, combinational logic coupled with FSMs, one or more code segments of an HDL, combinations thereof, and the like.

In various embodiments, the stage 13 includes an output 120 that may be a portion of a complex-number filtered discrete-time sample. The stage output 120 is typically received from the crosspoint switch 24, and may include either the in-phase portion or the quadrature portion of the complex-number data, depending on the stage 13. Stage 0 from FIG. 2 may produce the in-phase portion and Stage 1 may produce the quadrature portion. In some embodiments, the stage output 120 may include a complete complex-number filtered discrete-time sample. In other embodiments, the stage output 120 may include a real-number filtered discrete-time sample.

In various embodiments, the output formatter 14 is operable to combine the in-phase portion of a complex-number filtered discrete-time sample with the quadrature portion to form a single complex-number filtered discrete-time sample output 122. The in-phase portion may be received from the output 120 of Stage 0, while the quadrature portion may be received from the output 120 of Stage 1. In certain embodiments, the output formatter 14 is operable to combine either the complete filtered complex-number discrete-time sample or the filtered real-number discrete-time sample from two or more stage outputs 120. The combination creates a single output 122 that includes two or more stage outputs 120 on the same bus.

The FIR filter 10 may operate as follows. A signal is antialiasing filtered and discrete-time sampled to create a data stream of discrete-time samples external to the FIR filter 10. Discrete-time samples are forwarded to the input of the input formatter 12.

If the samples are real-number format samples, then the input formatter 12 may forward the samples to any of a plurality of stages 13. If the data stream is to be utilized in an external system that operates at a higher data sampling rate, then the data from the input formatter is forwarded to the interpolator 26 to have zero-valued data inserted into the sample stream. If a change in sampling rate is not desired, then the sample is forwarded to the crosspoint switch 24, which stores samples in the sample registers 16. If a linear-phase FIR filter is implemented, as in EQ. 3, then the sample, x(n), is forwarded through the crosspoint switch 24 to the arithmetic unit 20 to be added to the appropriate previous time sample, x(n−(N−1)). The sum is forwarded through the crosspoint switch 24 to the MAC unit 22. The sum is multiplied, in the multiplier module 40, by the appropriate coefficient, h(0), which is forwarded from the coefficient register 18. For the first term of the filter equation, there is no previous sum of products to which to add the first product and so the first term of the filter equation is added to zero, as seen in FIG. 4 or FIG. 6, to start the accumulation process. The sum is stored in one of the registers 112 of the registers module 44.

While the multiplication/accumulation process is beginning in the MAC unit 22, a new sum is calculated in the arithmetic unit 20, using the next two time samples, x(n−1) and x(n−(N−2)). The new sum is forwarded to the MAC unit 22 and is multiplied by the next coefficient h(1). The new product is added to the first product by using the feedback path 88, 116 as an input to the adder 94. The sum of products is stored in one of the accumulation registers 112. This procedure repeats until all the time samples have been added together (on a symmetric basis), multiplied by the proper coefficients, and added to the previous sum of products. The result is a new filtered discrete-time sample, y(n), that is forwarded to the output formatter 14 and to the filter output 122.

If a linear-phase filter is not implemented, then the step of the preliminary addition of the time samples on a symmetric basis is not performed. Time samples are forwarded from the sample registers 16 through the crosspoint switch 24 to the MAC unit 22, where the samples are multiplied by the appropriate coefficient and added to the sum of products until all time samples have gone through the multiply/accumulate process and a new filtered discrete-time sample, y(n), is produced and forwarded to the output formatter 14 and to the filter output 122.

If the discrete-time samples are complex-number samples, then the input formatter 12 may forward the complex-number sample to any of the stages 13, or the input formatter 12 may separate the complex number components and forward the in-phase portion to Stage 0 and the quadrature portion to Stage 1.

If the discrete-time sample is not split, then similar considerations to the real-number example apply. There are variations in the process depending on whether a linear-phase filter is implemented. If a linear-phase filter is utilized, then the time samples are added together in the arithmetic unit 20 on a symmetric basis. In-phase portions of the time samples are added together and quadrature portions are added together. The sum is forwarded to the MAC unit 22, where the sum is multiplied by the appropriate complex-number coefficient. If the two numbers have the form of (a+jb) and (c+jd), then their product takes the form (ac−bd)+j(ad+bc). The four intermediate products (ac, bd, ad, bc) are stored in registers 64, 66, 68, 70 and appropriately added or subtracted to create the in-phase portion of the product on multiplier OutA 80 and the quadrature portion on OutB 82. The product is forwarded to the adder module 40 and added to the sum of previous products. The addition, multiplication, and accumulation procedure continues until all previous time samples have been processed and y(n) is produced and forwarded to the output formatter 14 and to the filter output 122.

A non-linear-phase filter for complex numbers that are processed by one stage is similar to the non-linear-phase filter for real number samples. The preliminary addition step of the time samples is not performed. However, the multiplication and accumulation process is the same as described for the linear-phase complex-number filter above so that y(n) is produced and forwarded to the output formatter 14 and to the filter output 122.

If the discrete-time sample is split into in-phase and quadrature portions, then the in-phase portion is typically forwarded to Stage 0 and the quadrature portion is typically forwarded to Stage 1. If a linear-phase filter is implemented, then the arithmetic unit 20 of Stage 0 adds the in-phase portions of the discrete-time samples, and the arithmetic unit 20 of Stage 1 adds the quadrature portions of the discrete-time samples. Both sums are forwarded through the crosspoint switch 24 to both MAC units 22, such that the in-phase sum is forwarded to the Stage 1 MAC unit 22, and the quadrature portion is forwarded to the Stage 0 MAC unit 22. The multiplier module 40 of Stage 0 generates the in-phase portion (ac−bd) of the complex-number multiplication, and, at roughly the same time, the multiplier module 40 of Stage 1 generates the quadrature portion (ad+bc) of the complex-number product. Utilizing two multipliers to perform the complex-number multiplication significantly reduces the time required to perform FIR filtering since multiplication is generally a time-consuming operation.

The adder module 42 of Stage 0 accumulates the in-phase product with the in-phase sum of products to produce the in-phase portion of y(n). The adder module 42 of Stage 1 accumulates the quadrature product with the quadrature sum of products to produce the quadrature portion of y(n). The output formatter 14 receives the in-phase portion of y(n) from the output 120 of Stage 0 and the quadrature portion from the output 120 of Stage 1 and combines the two to form the filtered complex-number discrete-time sample, y(n).

The non-linear-phase FIR filter 10 performs similarly to the linear-phase filter in which the in-phase and quadrature components are processed by different stages 13. The preliminary time-sample addition step is not performed. Instead complex-number discrete-time samples are forwarded to the MAC units 22 of both Stage 0 and Stage 1 and complex-number multiplication is performed as described above. The products are accumulated as described above and the output formatter 14 receives the in-phase portion of y(n) from the output 120 of Stage 0 and the quadrature portion from the output 120 of Stage 1 and combines the two to form the filtered complex-number discrete-time sample, y(n).

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A finite impulse response filter, the filter comprising:
   an input formatter, operable to decompose a complex-number discrete-time sample into an in-phase sample and a quadrature sample;
   a plurality of sample registers, operable to store a plurality of a complex-number discrete-time samples;
   a plurality of coefficient registers, operable to store a plurality of complex-number coefficients;
   an in-phase arithmetic unit, operable to create an in-phase sum by adding two in-phase samples from the complex-number discrete-time samples;
   a quadrature arithmetic unit, operable to create a quadrature sum by adding two quadrature samples from the complex-number discrete-time samples;
   a single in-phase multiply accumulate unit, including
      a multiplier module, including
         a single multiplier operable to multiply the in-phase sum and the quadrature sum by a complex-number coefficient to create four intermediate products,
         a demultiplexer including a first input to receive the intermediate products and four outputs,
         first, second, third, and fourth registers, each register receiving and storing one of the intermediate products,
         a first adder to add first and second intermediate products to create a first sum,
         a second adder to add third and fourth intermediate products to create a second sum,
         a first multiplexer including a first input to receive the first intermediate product, a second input to receive the first sum, and an output to supply an in-phase product, and
         a second multiplexer including a first input to receive the second sum, a second input to receive a zero value, and an output to supply a quadrature product,
      an in-phase adder module, operable to add the in-phase product to an in-phase sum of products, and
      an in-phase register, operable to store the in-phase sum of products; and
   a single quadrature multiply accumulate unit, including
      a quadrature adder module, operable to add the quadrature product to a quadrature sum of products, and
      a quadrature register, operable to store the quadrature sum of products;
   an output formatter, operable to combine the in-phase sum of products and the quadrature sum of products to produce a filtered complex-number discrete-time sample; and
   a control unit, operable to control the settings of the single in-phase arithmetic unit, the single quadrature arithmetic unit, the in-phase multiply accumulate unit, and the quadrature multiply accumulate unit in order to control multiplication and accumulation of numbers using the single multiplier in the in-phase multiplier module and the single multiplier in the quadrature multiplier module.

2. The finite impulse response filter of claim 1, further comprising a crosspoint switch, operable to manage the flow of data from the first and second plurality of registers to the in-phase arithmetic unit, the quadrature arithmetic unit, the in-phase multiply accumulate unit, and the quadrature multiply accumulate unit.

3. The finite impulse response filter of claim 1, further comprising an interpolator, operable to insert a desired number of zeros into a stream of discrete-time samples to adjust the stream of discrete-time samples to an increasing sampling rate.

4. The finite impulse response filter of claim 1, wherein the number of coefficients equals N, that are assigned numbers 1 through N, and the values of the coefficients are symmetric about the midpoint of N, such that if N is even, then coefficient (N/2) is equal to coefficient (N/2+1), coefficient (N/2-1) is equal to coefficient (N/2+2) and so forth until coefficient (1) is equal to coefficient (N); if N is odd, then coefficient ((N+1)/2) is the center coefficient and coefficient ((N+1)/2-1) is equal to coefficient ((N+1)/2+1) and so forth until coefficient (1) is equal to coefficient (N).

5. The finite impulse response filter of claim 1, wherein the multiply accumulate unit further includes a scaler, operable to adjust the magnitude of the sum of products.

6. A linear-phase finite impulse response filter, the filter comprising:
- an input formatter, operable to decompose a complex-number discrete-time sample into an in-phase component and a quadrature component;
- a plurality of sample registers, operable to store a plurality of a complex-number discrete-time samples;
- a plurality of coefficient registers, operable to store a plurality of complex-number coefficients, wherein the number of coefficients equals N, that are assigned numbers 1 through N, and the values of the coefficients are symmetric about the midpoint of N, such that if N is even, then coefficient (N/2) is equal to coefficient (N/2+1), coefficient (N/2-1) is equal to coefficient (N/2+2) and so forth until coefficient (1) is equal to coefficient (N); if N is odd, then coefficient ((N+1)/2) is the center coefficient and coefficient ((N+1)/2-1) is equal to coefficient ((N+1)/2+1) and so forth until coefficient (1) is equal to coefficient (N);
- a single in-phase arithmetic unit, operable to create an in-phase sum by adding two in-phase samples from the time-sampled complex-number data stream;
- a single quadrature arithmetic unit, operable to create a quadrature sum by adding two quadrature samples from the time-sampled complex-number data stream;
- an in-phase multiply accumulate unit, including
    - a multiplier module, including
        - a single multiplier operable to multiply the in-phase sum and the quadrature sum by a complex-number coefficient to create four intermediate products,
        - a demultiplexer including a first input to receive the intermediate products and four outputs,
        - first, second, third, and fourth registers, each register receiving and storing one of the intermediate products,
        - a first adder to add first and second intermediate products to create a first sum,
        - a second adder to add third and fourth intermediate products to create a second sum,
        - a first multiplexer including a first input to receive the first intermediate product, a second input to receive the first sum, and an output to supply an in-phase product, and
        - a second multiplexer including a first input to receive the second sum, a second input to receive a zero value, and an output to supply a quadrature product,
    - an in-phase adder module, operable to add the in-phase product to an in-phase sum of products, and
    - an in-phase register, operable to store the in-phase sum of products;
- a quadrature multiply accumulate unit, including
    - a quadrature adder module, operable to add the quadrature product to a quadrature sum of products, and
    - a quadrature register, operable to store the quadrature sum of products;
- an output formatter, operable to combine the in-phase sum of products and the quadrature sum of products to produce a filtered complex-number discrete-time sample; and
- a control unit, operable to control the settings of the single in-phase arithmetic unit, the single quadrature arithmetic unit, the in-phase multiply accumulate unit, and the quadrature multiply accumulate unit in order to control multiplication and accumulation of numbers using the single multiplier in the in-phase multiplier module and the single multiplier in the quadrature multiplier module.

7. The finite impulse response filter of claim 6, further comprising a crosspoint switch, operable to manage the flow of data from the first and second plurality of registers to the in-phase arithmetic unit, the quadrature arithmetic unit, the in-phase multiply accumulate unit, and the quadrature multiply accumulate unit.

8. The finite impulse response filter of claim 6, further comprising an interpolator, operable to insert a desired number of zeros into a stream of discrete-time samples to adjust the stream of discrete-time samples to an increasing sampling rate.

* * * * *